United States Patent [19]
Masuda et al.

[11] Patent Number: 5,706,205
[45] Date of Patent: Jan. 6, 1998

[54] APPARATUS AND METHOD FOR HIGH-LEVEL SYNTHESIS OF A LOGIC CIRCUIT

[75] Inventors: Atsushi Masuda, Kanagawa-ken; Masatoshi Sekine, Tokyo; Jeffery P. Hansen, Kanagawa-ken, all of Japan

[73] Assignee: Kabushiki Kaisha Toshiba, Kawasaki, Japan

[21] Appl. No.: 534,065

[22] Filed: Sep. 26, 1995

[30] Foreign Application Priority Data

Sep. 30, 1994 [JP] Japan .................................. 6-261668

[51] Int. Cl.$^6$ .................................................. G06F 17/50
[52] U.S. Cl. .............................................. 364/489; 364/488
[58] Field of Search ...................................... 364/488, 489, 364/490

[56] References Cited

U.S. PATENT DOCUMENTS

| | | |
|---|---|---|
| 5,452,215 | 9/1995 | Washabaugh ............... 364/489 |
| 5,490,082 | 2/1996 | Rowson ..................... 364/489 |
| 5,513,122 | 4/1996 | Cheng et al. ............... 364/489 |
| 5,515,292 | 5/1996 | Roy et al. ................... 364/489 |
| 5,519,627 | 5/1996 | Mahmood et al. ......... 364/488 |
| 5,555,201 | 9/1996 | Dangelo et al. ............ 364/489 |
| 5,563,800 | 10/1996 | Matsumoto et al. ....... 364/489 |

OTHER PUBLICATIONS

"An Overview of Logic Synthesis Systems" by L. Trevillyan, 24th ACM/IEEE Design Automation Conference, 1987, pp. 166–172.

G. De Micheli, "Synthesis and Optimization of Digital Circuits", McGraw–Hill Inc., 1994, pp. 441–459 and 490495.

Toshiaki Miyazaki et al. "High–Level Synthesis Using Given Datapath Information" ICEC Trans. Fundamentals, vol. E76–A, No. 10 Oct. 1993 pp. 1617–1625.

*Primary Examiner*—Vincent N. Trans
*Attorney, Agent, or Firm*—Foley & Lardner

[57] ABSTRACT

A high-level synthesis apparatus synthesizes a large-scale logic circuit. The apparatus has a unit for generating a control description graph according to a behavioral description graph written in a behavioral description language; a unit for sorting the control description graph according to control conditions and extracting single flows including partial graphs or closed loops from the sorted control description graph; a unit for providing an initial circuit; a unit for dividing the single flows into execution steps; a unit for allocating hardware parts of the initial circuit to the execution steps; and a unit for converting each of the single flows into a finite state machine and combining the finite state machines into one. This apparatus optimizes each single flow and adds parts to or modifies the initial circuit, to synthesize a large-scale circuit.

20 Claims, 13 Drawing Sheets

| G1 | D11<br>D12 | +<br>+ | R1<br>R1 | $X_1$<br>$X_2$ | R1<br>R2 | +<br>+ | R1<br>R1 | +<br>+ | R1<br>R1 | −<br>− |
|---|---|---|---|---|---|---|---|---|---|---|
| G2 | D21<br>D22 | −<br>− | R3<br>R3 | $X_1$<br>$X_2$ | R1<br>R2 | −<br>− | R3<br>R3 | | | |
| G3 | D3 | + | R1 | + | R1 | − | R3 | + | R1 | − |

FIG.13

APPARATUS AND METHOD FOR HIGH-LEVEL SYNTHESIS OF A LOGIC CIRCUIT

BACKGROUND OF THE INVENTION

1. Field of the Invention

The present invention relates to a method of and an apparatus for synthesizing a logic circuit, and particularly, to a method of and an apparatus for carrying out a high-level synthesis to synthesize a logic circuit from a behavioral description.

2. Description of the Prior Art

A high-level synthesis technique synthesizes a logic circuit from a behavioral description. This technique is disclosed in, for example, "High Level Synthesis of ASICs Under Timing and Synchronization Constraints" by David C. Ku and Giovanni De Micheli, Kluwer Academic Publishers, 1992. This disclosure extracts a control data flow graph (CDFG) from a behavioral description, allocates operators to the CDFG, carries out the scheduling of the CDFG to divide the CDFG into execution steps according to the execution time of each operator, and allocates or shares hardware resources such as registers to or among the execution steps. In this way, the high-level synthesis converts a behavioral description into a hardware system.

This technique simply synthesizes a hardware control structure from a CDFG, and therefore, is effective only for a small-scale system. The technique is incapable of providing an optimum control structure for a large-scale system. When manually allocating hardware resources to a CDFG, a designer may deal with extra control conditions not included in the original CDFG. The prior art is incapable of handling such extra conditions. The prior art carries out the scheduling and hardware sharing on a CDFG all at once, to synthesize a logic circuit. This is effective only for a small-scale system. The technique may synthesize a large-scale system that is practically inferior to a manually designed system. This is because the prior art forms a CDFG by extracting only serial operations from a high-level description or from an abstract system written in a behavioral description language. The control structure of the CDFG does not always correspond to a hardware control system. In addition, the CDFG provides information only about a flow of data and nothing about hardware connections required for high-level synthesis. Some researchers, therefore, give up high-level synthesis on software and try to synthesize a system from a finite state machine (FSM). An object of the high-level synthesis is, however, to create an FSM from a high-level description that includes no description about hardware.

SUMMARY OF THE INVENTION

An object of the present invention is to provide an apparatus for properly synthesizing a large-scale logic circuit.

In order to accomplish the object, the present invention provides an apparatus for synthesizing a logic circuit, capable of creating a finite state machine (FSM) whose quality is equal to one manually made, from a high-level CDFG. Similar to the manual technique, the present invention gradually forms the FSM by selecting proper ones among many candidate parts.

According to a first aspect of the present invention, an apparatus for synthesizing a logic circuit employs an initial circuit corresponding to a given behavioral description and designs a required logic circuit by adding parts to the initial circuit. Unlike the prior art that checks a huge design space containing every initial circuit, the present invention checks parts of a given initial circuit through a limited number of search operations, adds parts to the initial circuit or modifies the initial circuit, and surely provides a required logic circuit.

According to a second aspect of the present invention, an apparatus for synthesizing a logic circuit (FIGS. 1 to 3) has a unit 200 for generating a control description graph according to a behavioral description graph 100 written in a behavioral description language, a unit 300 for sorting the control description graph according to control conditions and extracting single flows including partial graphs or closed loops from the sorted control description graph, a unit 400 for providing an initial circuit, a unit 500 for dividing the single flows into execution steps, a unit 600 for allocating hardware parts of the initial circuit to the execution steps, and a unit 800 for converting each of the single flows into a finite state machine (FSM) and combining the FSMs into one.

Figure 4:
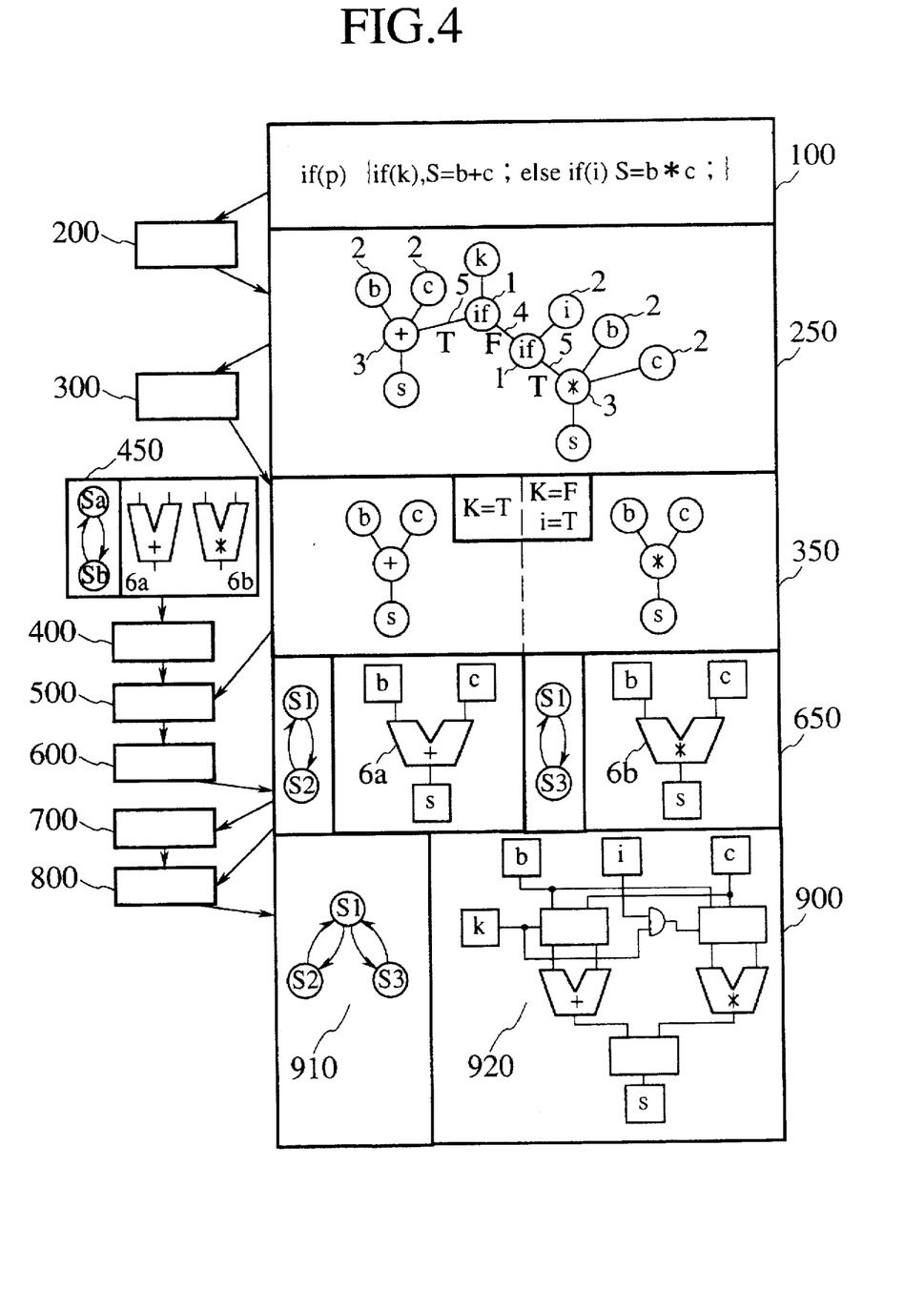
FIG. 4 explains the operation of the first embodiment.

The second aspect of the present invention extracts partial graphs 350 according to conditional values of control variables as shown in FIG. 4. Each partial graph is scheduled according to the conventional high-level synthesis technique, to find the number of execution steps and the number of registers needed for executing the partial graph. The hardware allocation unit 600 allocates ALUs to each partial graph. Each string of the execution steps obtained by the scheduling is mapped into a state of an FSM. Preparing the data path and FSM of each partial graph is made by modifying the initial circuit designed by a designer. The partial graphs are connected together into a full graph. At this time, overlapping partial graphs are summed by computing the sum of logical expressions indicating conditional values. The logical expressions are simplified by optimization.

Figure 10:
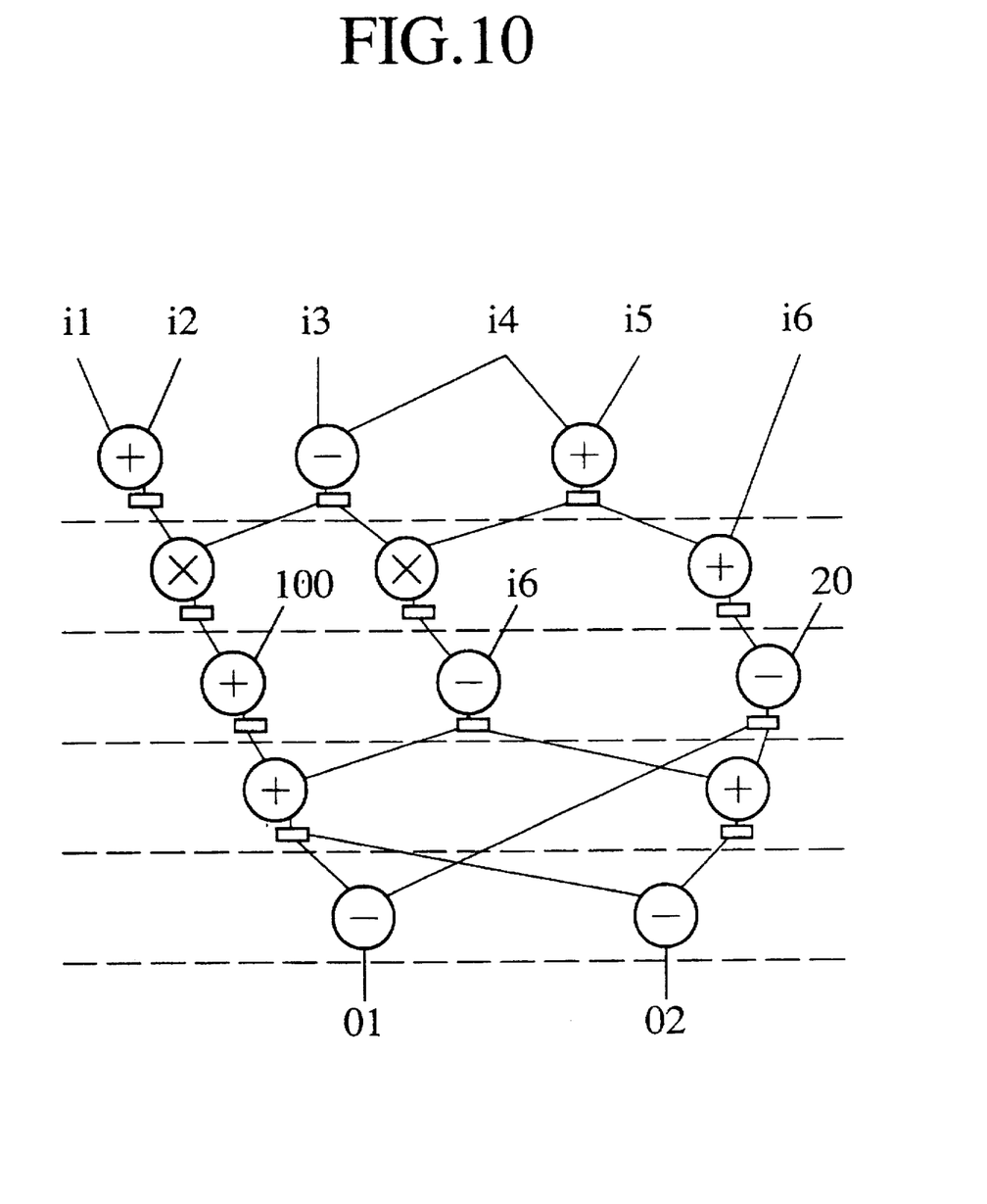
FIG. 10 shows a scheduled state of the CDFG of FIG. 8.

In this way, the second aspect of the present invention analyzes a behavioral description (FIG. 7), creates a CDFG (FIG. 8) therefrom, carries out the scheduling of each partial graph, and temporally divides the CDFG into execution steps (FIG. 10). Hardware resources are allocated to the parts of the CDFG such that the same operation will not be repeated in the same execution time. Unlike the prior art that directly reflects the control structure of a behavioral description to a hardware control structure, the present invention converts the behavioral description into a control structure proper for a hardware structure. While the prior art provides a redundant circuit inferior to a manually designed circuit, the present invention is capable of synthesizing a circuit approximately equivalent to the manually designed circuit. When appropriate, the present invention represents partial circuits with matrices and processes the matrices to synthesize an optimum circuit.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

The apparatus for high-level synthesis according to the present invention may be a computer system having a CPU, an input device such as a keyboard, mouse, light pen, or flexible disk unit, an external storage device such as a memory device or disk unit, and an output device such as a display or printer. The CPU includes ALUs for carrying out various processes and a main memory for storing instructions for the processes. An input interface is arranged between the CPU and the input device, and an output interface is arranged between the CPU and the output device.

First embodiment

Figure 1:
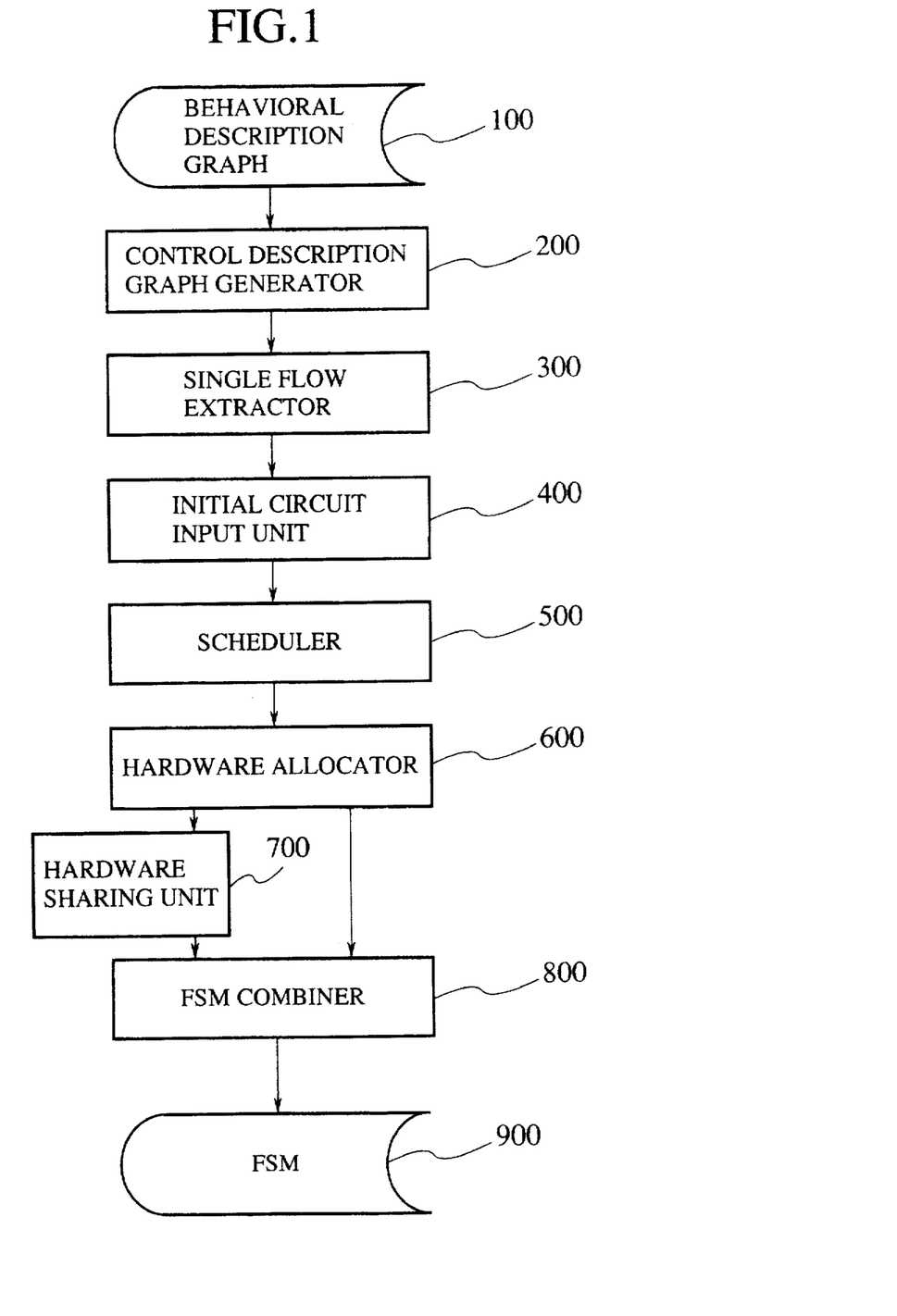
FIG. 1 is a block diagram showing a software structure of an apparatus for high-level synthesis according to a first embodiment of the present invention.

FIG. 1 is a block diagram showing a software structure of an apparatus for high-level synthesis according to the first embodiment of the present invention. A control description graph generator 200 forms a control description graph according to a behavioral description written in a behavioral description language. A single flow extractor 300 sorts the control description graph according to control conditions and extracts single flows including partial graphs or closed loops therefrom. An initial circuit input unit 400 provides an initial circuit. A scheduler 500 divides the single flows into execution steps. A hardware allocator 600 allocates hardware parts of the initial circuit to software operator on every execution step. An FSM combiner 800 converts each single flow into an FSM (finite state machine) and combines the FSMs into one.

Figure 2:
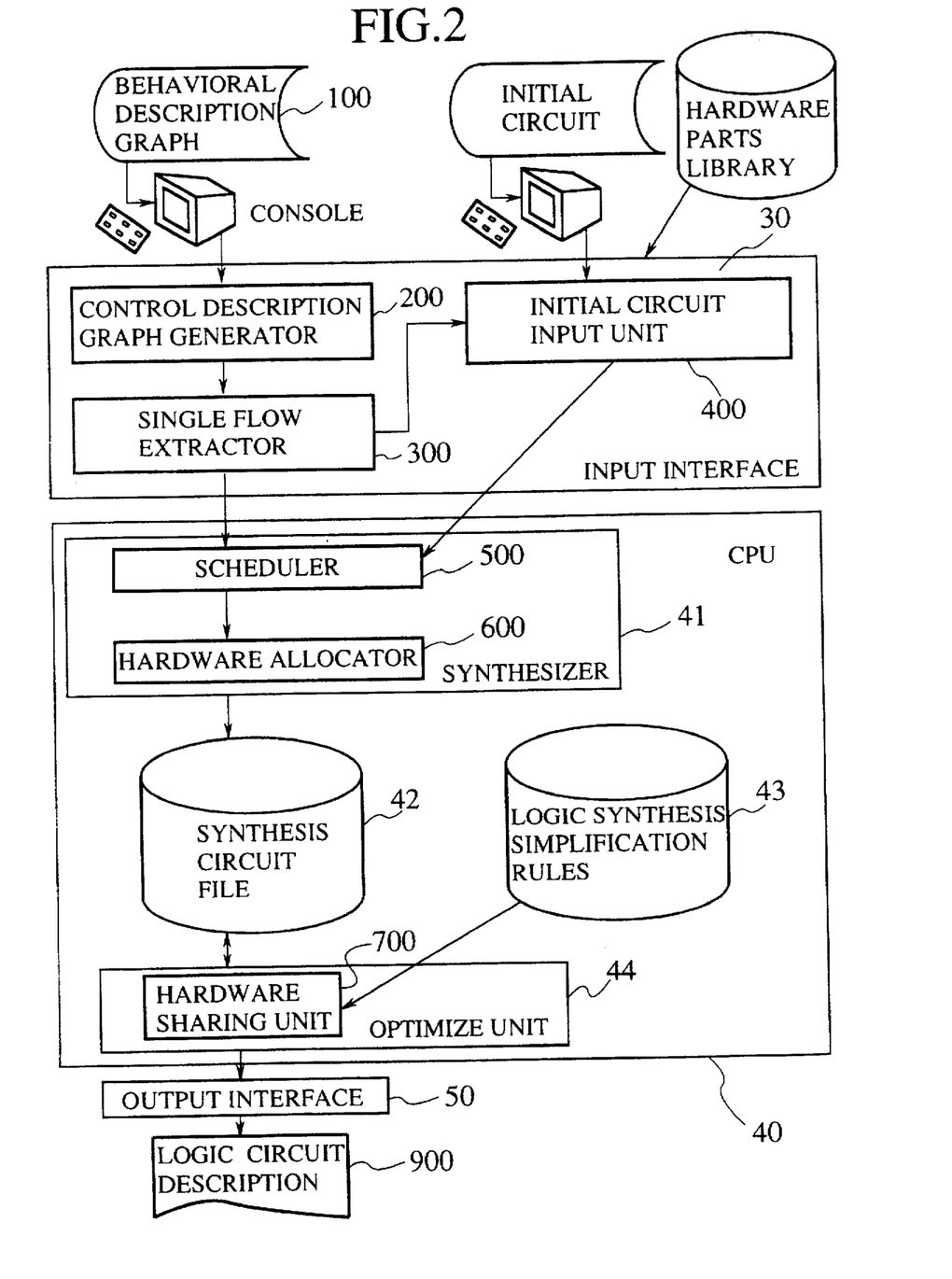
FIG. 2 is a block diagram showing a hardware structure of the apparatus of the first embodiment.

FIG. 2 is a block diagram showing a hardware structure of the apparatus of the first embodiment. A CPU 40 has a synthesizer 41, an optimize unit 44, a memory 42 for storing synthesis circuit files, and a memory 43 for storing logic synthesis simplification rules. The synthesizer 41 has the scheduler 500 and hardware allocator 600. The optimize unit 44 has a hardware sharing unit 700. An input interface 30 between an input device and the CPU 40 includes the control description graph generator 200, single flow extractor 300, and initial circuit input unit 400. The input device provides the input interface 30 with the behavioral description graph 100, an initial circuit, and data from a hardware parts library stored in an external storage unit. The output of the CPU 40 is connected to an output interface 50 having the FSM combiner 800 for providing an output device with an FSM 900.

The single flow extractor 300 analyzes the control description graph and extracts partial graphs, i.e., partial circuits therefrom. In consideration of the partial circuits, an initial circuit is given to the initial circuit input unit 400. Instead, the initial circuit may be provided at first as shown in FIG. 3.

Figure 3:
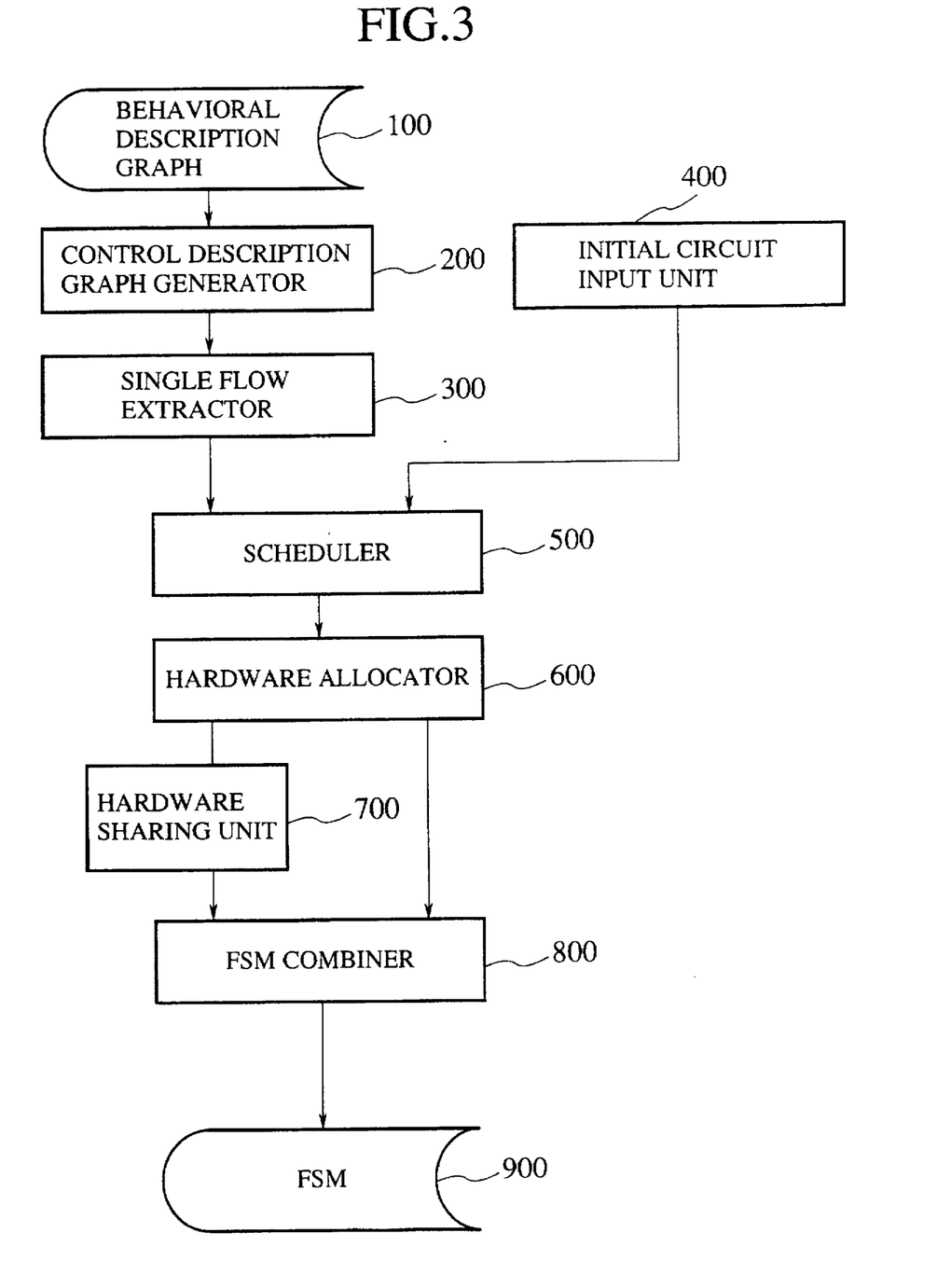
FIG. 3 is a block diagram showing another software structure of the apparatus of the first embodiment.

FIG. 3 shows another software structure of the apparatus of the first embodiment. The operation of the first embodiment will be explained with reference to FIGS. 3 and 4.

(1) The behavioral description graph 100 includes a control variable P. According to conditional values of the variable P, a sum "+" or a product "*" is carried out such as "s=b+c" or "s=b*c." The behavioral description graph 100 is written in a behavioral description language, which is "programming language C" in FIG. 4. The control description graph generator 200 reads the behavioral description graph 100, analyzes the syntax of the same according to a compiler technique, and forms a parse tree, i.e., a control description graph. The parse tree is rearranged into a control data flow graph (CDFG) 250. A control variable "k" or "i" is entered to select a partial graph at an IF node i in the CDFG 250. If it is true at the node 1, a branch 5 is selected, and if it is false, a branch 4 is selected.

(2) The single flow extractor 300 reads the CDFG 250, analyzes the same, and finds control nodes and the values of the control variables and conditional expressions. The single flow extractor 300 extracts from the CDFG 250 partial graphs 350 containing uniquely determined closed loops. When a given partial graph includes a closed loop, i.e., a single flow with no branching, conditions to escape from the closed loop are different from the conditions for selecting the partial graph.

(3) An operator enters an initial circuit to the initial circuit input unit 400. The initial circuit may be prepared with a graphical user interface (GUI) or provided as a file. This embodiment employs a hardware library 450 that stores basic hardware parts including input terminals, output terminals, the number of execution steps, and connectable parts. Required parts are read out of the library 450.

(4) The scheduler 500 divides each partial graph 350 into execution steps according to the execution time of each operator. The execution steps of the partial graphs that are in the same execution period are simultaneously executed.

(5) The hardware allocator 600 allocates the hardware parts of the initial circuit to each partial graph 350. Connection lines to connect the hardware parts to one another are temporary. The hardware parts such as I/O terminals and the number of execution steps of the initial circuit provided by the initial circuit input unit 400 are defined in the hardware library 450. The initial circuit is modified to prepare hardware data paths 650. To optimize the initial circuit, one among various optimization algorithms is employed. For example, a knapsack algorithm disclosed in "Knapsack Problems" by Silvano Martello Paolototh, John Wiley & Sons, 1990, treats individual ALUs as knapsacks and data paths as items, to find an optimum circuit. A different algorithm provides a different optimum circuit. The present invention gradually adds parts to and modifies the initial circuit, thereby optimizing the initial circuit. Namely, the present invention finds local optimum solutions near the initial circuit.

(6) The hardware sharing unit 700 integrates the hardware parts that achieve the same function and are used in different time bands into one. For example, if there are a plurality of partial graphs 350 each corresponding to a statement of "s=b+c" and if they are used in different execution steps, a data path 6a will be sufficient for them. This kind of sharing reduces the number of parts. A selector is added to each of the input and output terminals of each shared part, to select an input source and an output destination for the shared part. The number of selectors drastically increases according to an increase in the number of branching conditions, so that they must be minimized by logic simplification.

(7) The FSM combiner 800 allocates each execution step of each partial graph to a state of an FSM. Hardware parts that provide an identical function are allocated to the same state of the FSM. A conditional branch of the CDFG may be converted into a performance transition branch or to a data path branch. Finally, the embodiment provides an FSM 900 whose control structure is different from that of the CDFG.

Figure 5:
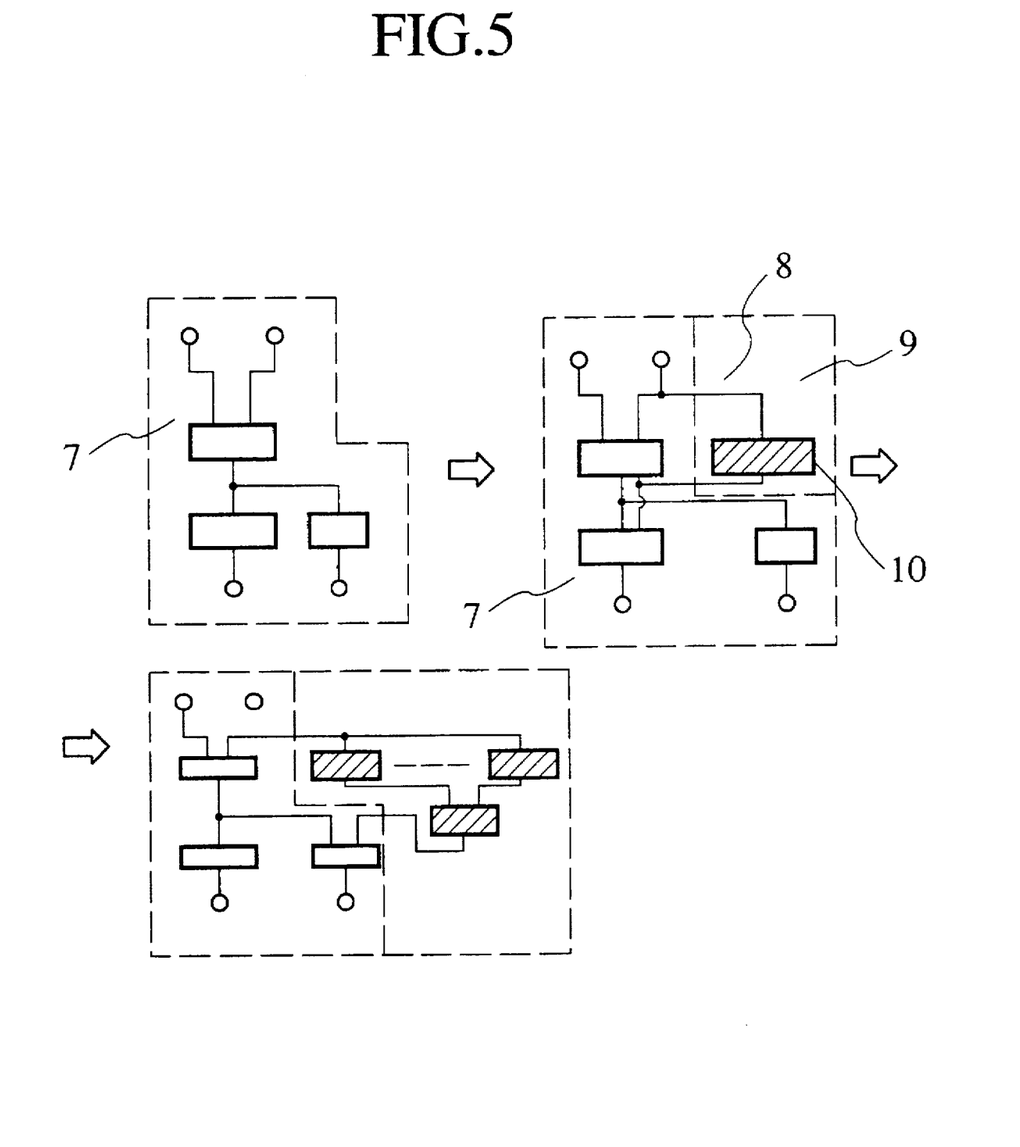
FIG. 5 explains adding parts to and modifying an initial circuit.

FIG. 5 explains adding circuit parts to an initial circuit 7 by the hardware allocator 600 to form a final circuit.

If the initial circuit 7 is insufficient, an additional ALU 10 and connection lines 8 to the ALU 10 are added to form an additional circuit 9. The additional circuit 9 is added to the initial circuit 7, to provide a final circuit. This will be explained in detail in the second embodiment.

As explained above, this embodiment employs a small-scale initial circuit designed by a designer as a basic composition of a system and forms an FSM based on the initial circuit, to thereby create a large-scale circuit.

Second embodiment

Figure 6:
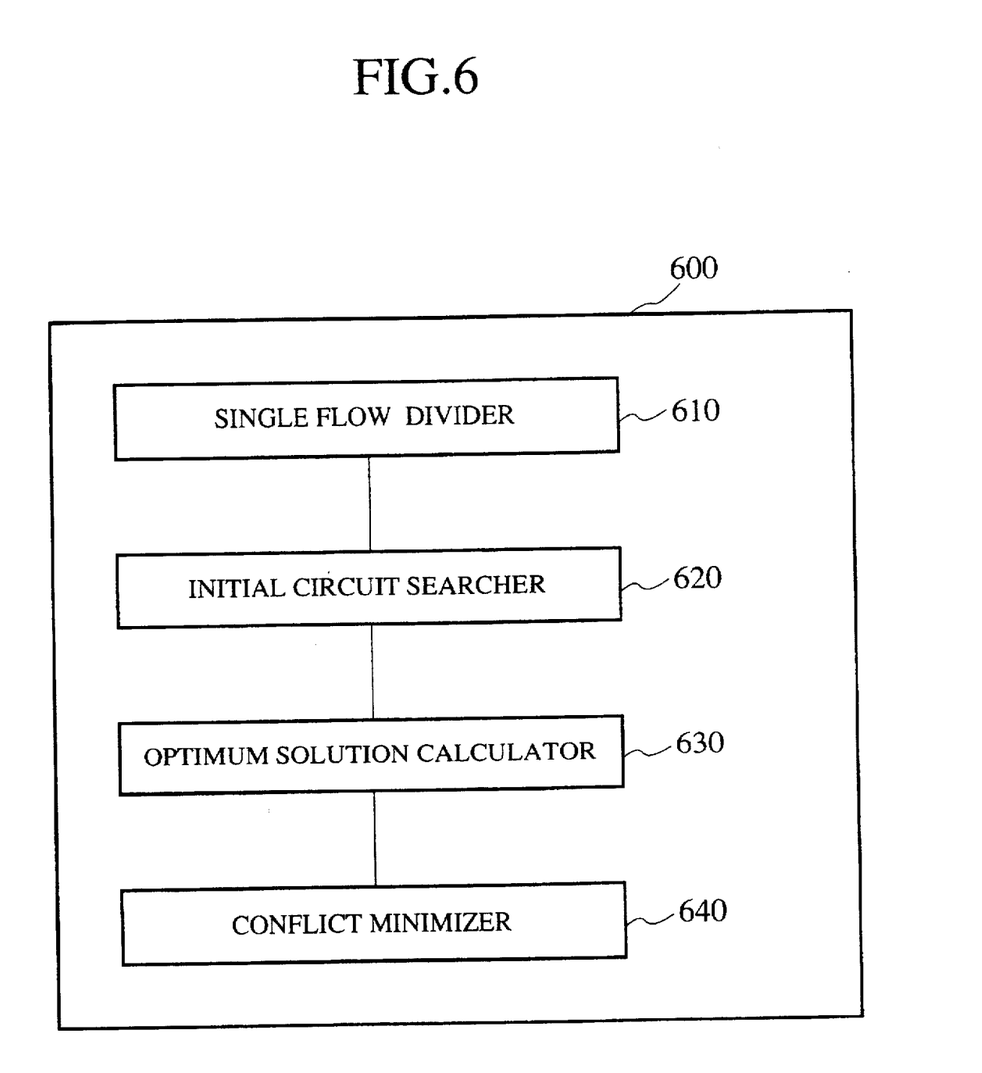
FIG. 6 is a block diagram showing a part of an apparatus for high-level synthesis according to a second embodiment of the present invention.

The second embodiment shown in FIG. 6 relates to the details of the hardware allocator 600 of the first embodiment. A single flow divider 610 divides single flows into paths without overlapping operators among the paths. An initial circuit searcher 620 searches the parts (partial circuits) of an initial circuit for candidate parts that may realize, the paths. An optimum solution calculator 630 finds an optimum combination of parts (partial circuits) for realizing the paths among the candidate parts. A conflict minimizer 640 finds a minimum combination of additional parts for realizing the paths if no optimum combination of parts is found by the optimum solution calculator, and adds the parts to the initial circuit.

The second embodiment will be explained according to a flow of processes.

Figure 7:
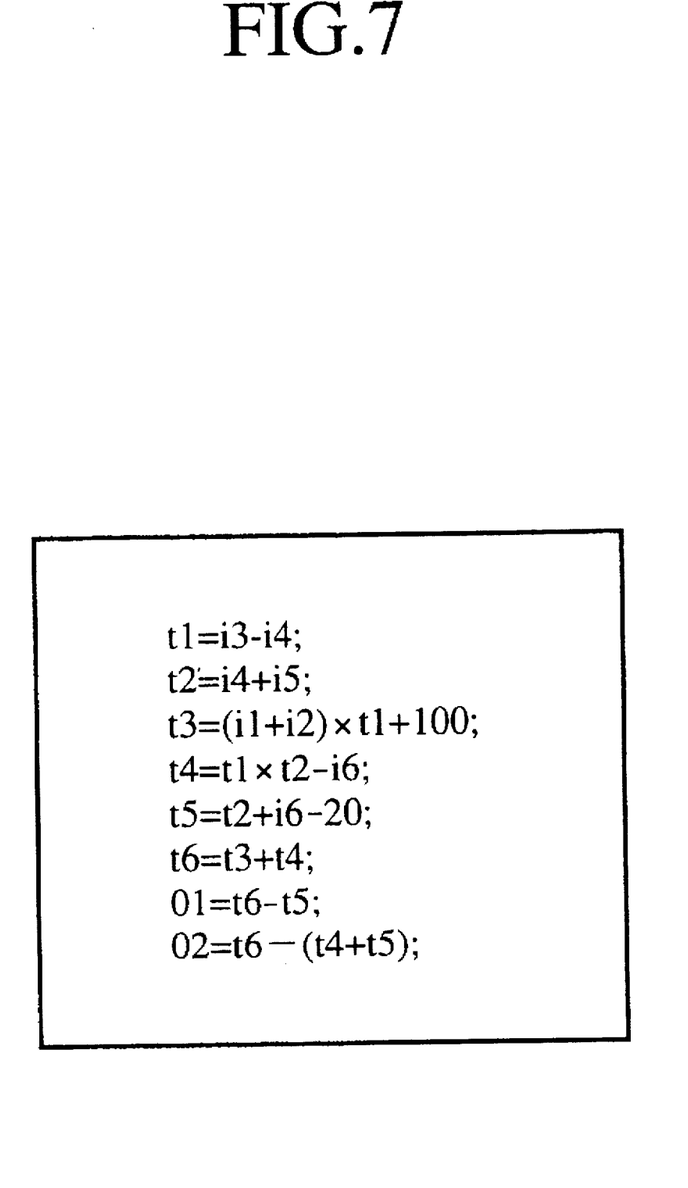
FIG. 7 shows an example of a behavioral description according to the second embodiment.
Figure 8:
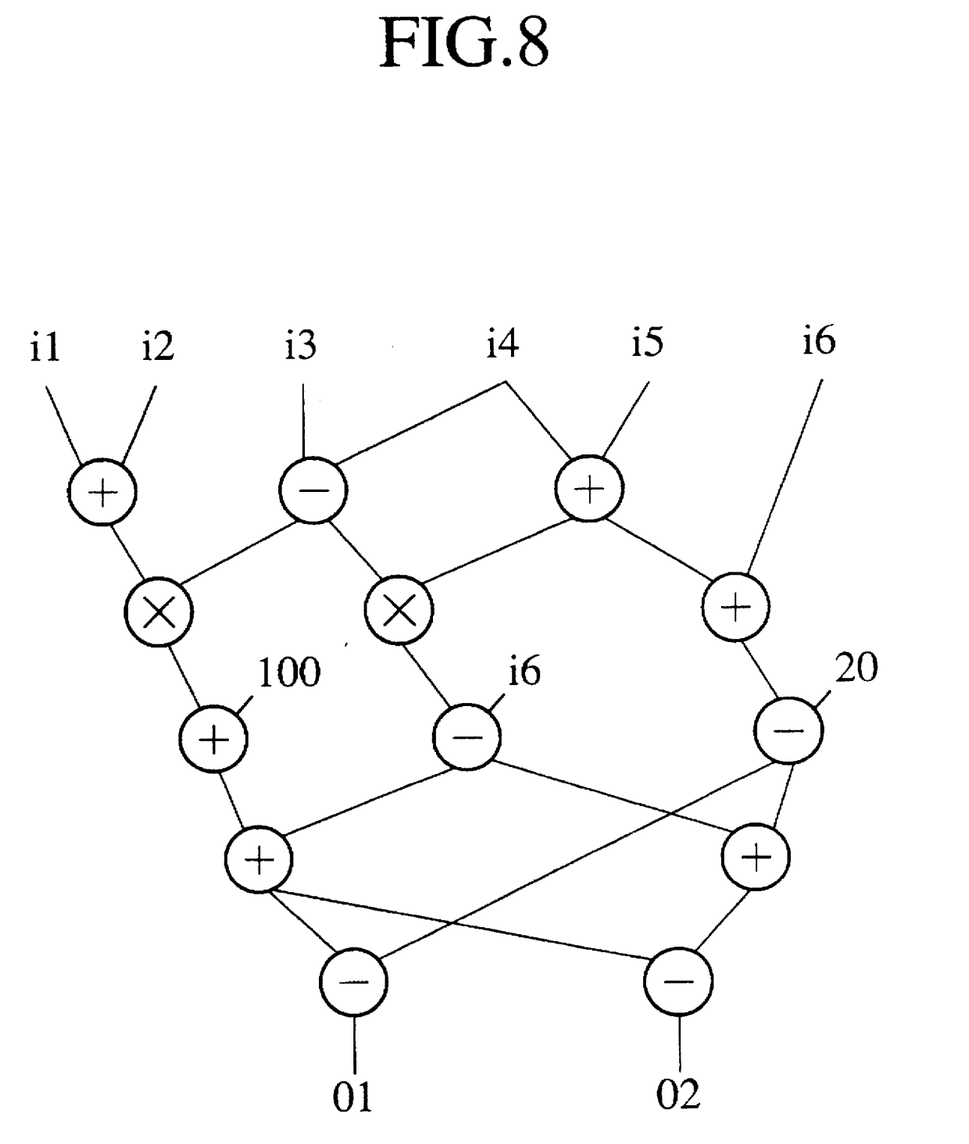
FIG. 8 shows a control data flow graph (CDFG) corresponding to the behavioral description of FIG. 7.

(1) FIG. 7 shows an example of an input behavioral description. FIG. 8 shows a CDFG formed from the description of FIG. 7. The CDFG shows paths of data supplied to input terminals, processed in various ways, and transferred to output terminals.

Figure 9:
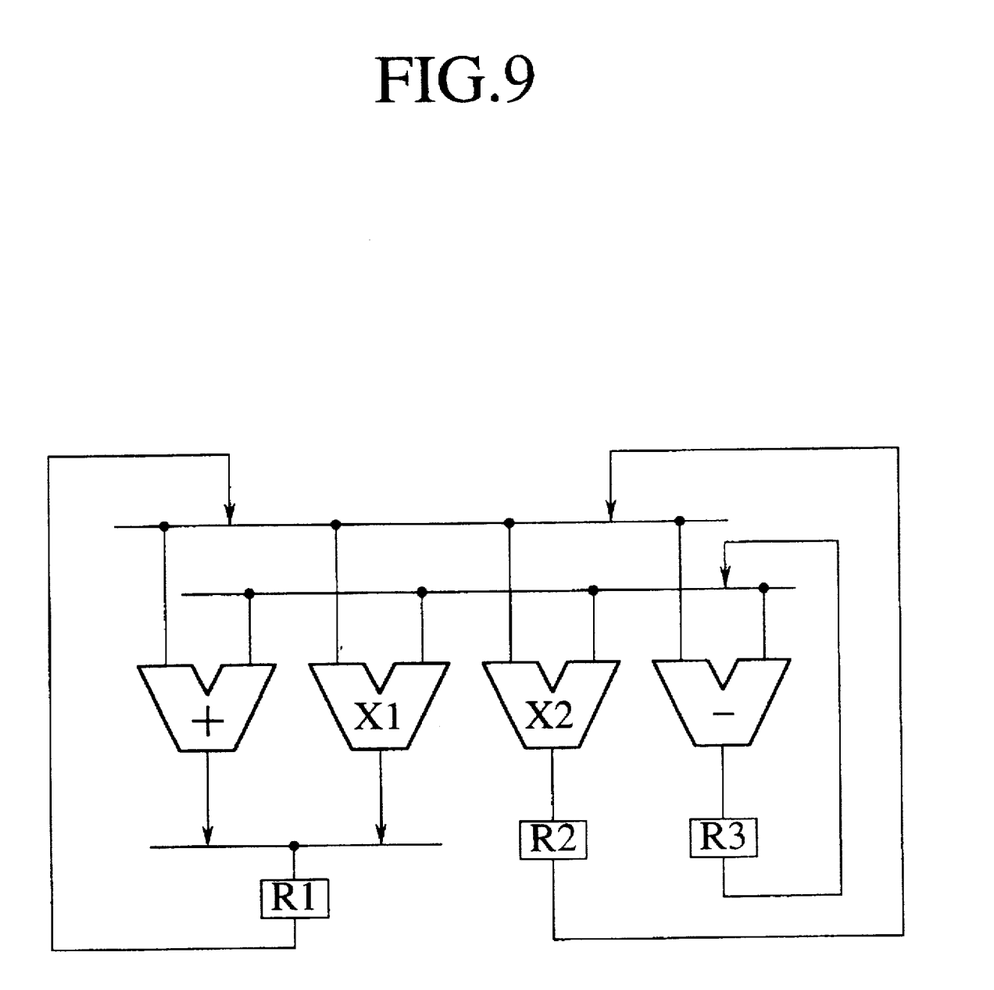
FIG. 9 shows an initial circuit according to the second embodiment.

(2) The initial circuit input unit 400 provides an initial circuit shown in FIG. 9. The initial circuit may be prepared through a graphical user interface or provided as a file. The initial circuit includes registers and R3, an adder "+," a subtracter "−," and multipliers "X1" and "X2".

(3) The scheduler 500 temporally divides the CDFG into execution steps as shown in FIG. 10. Each dotted line represents a changeover point of a clock signal. A register (a rectangular mark under an operator in FIG. 10) is used to transfer data over a changeover point. In FIG. 10, data is processed in five cycles.

Figure 11:
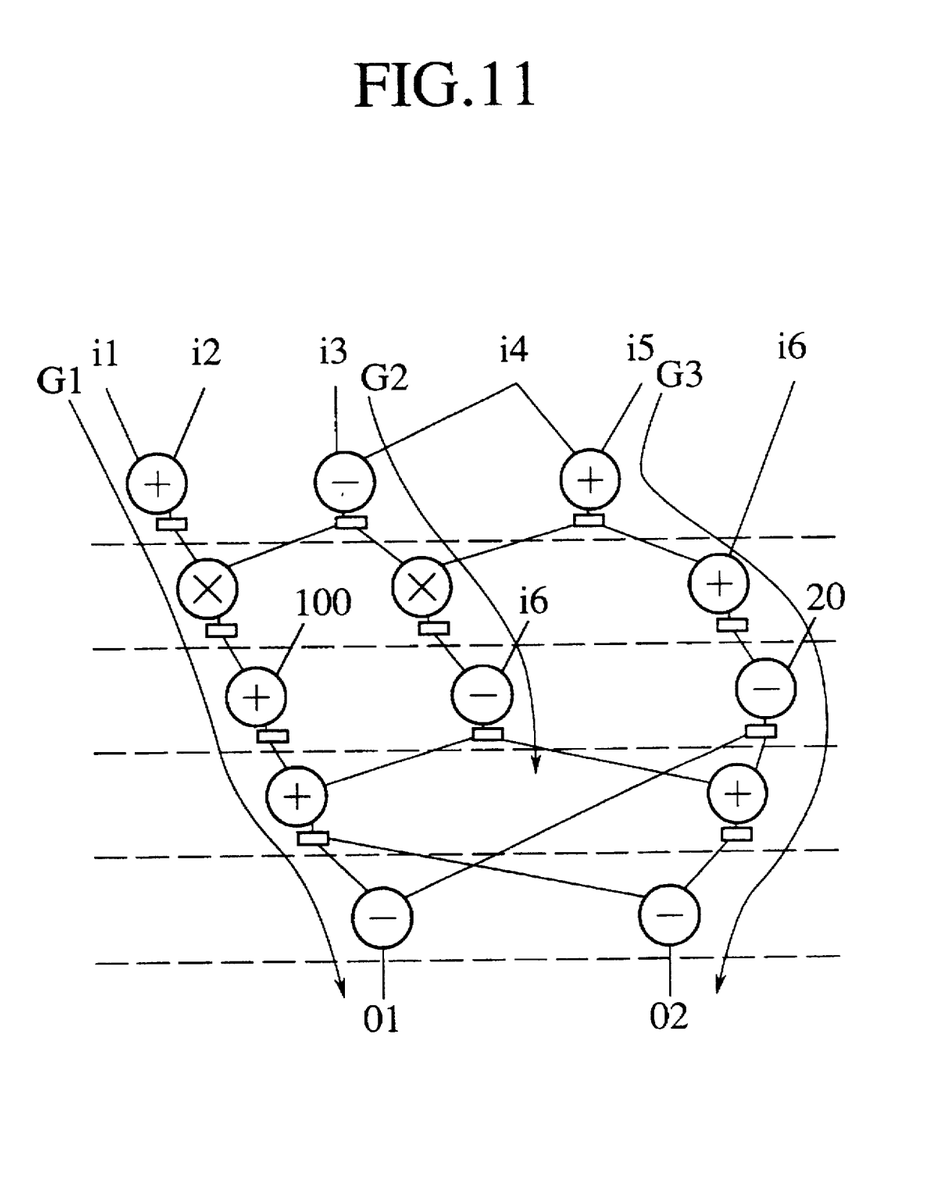
FIG. 11 explains paths made on the CDFG of FIG. 8.

(4) The single flow divider 610 of the hardware allocator 600 divides the single flows of the CDFG into paths G1 to G3 as shown in FIG. 11 without overlapping operators among the paths. For example, the path G1 involves input terminals, an adder, a register, a multiplier, a register, an adder, a register, an adder, a register, a subtracter, and an output terminal. The paths G1 to G3 are called each a G path.

Figure 12:
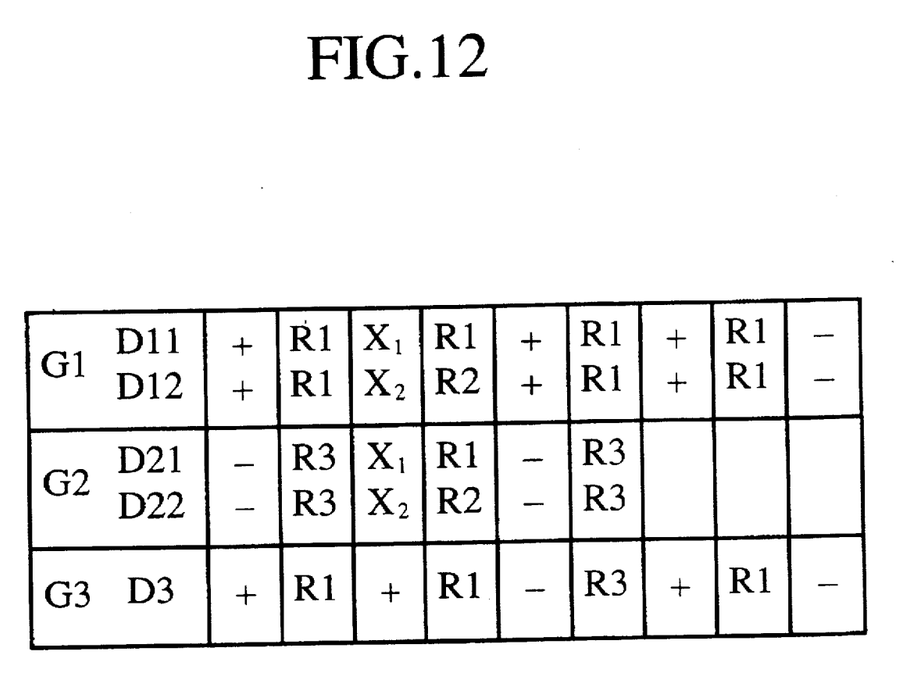
FIG. 12 shows a result of search for hardware resources according to the second embodiment.

(5) The initial circuit searcher 620 searches the initial circuit of FIG. 9 for data paths corresponding to the G paths. For example, a data path corresponding to the G path G1 involves the elements +, R1, X1, R1, +, R1, +, R1, and −. Usually, there are a plurality of data paths for each G path. The present invention limits candidate data paths to a finite number, to restrict the number of solutions to be searched to a finite value. FIG. 12 shows candidate data paths for the G paths G1 to G3. The G path G1 has candidate data paths D11 and D12, the G path G2 has candidate data paths D21 and D22, and the G path G3 has a candidate data path D3.

(6) The optimum solution calculator 630 allocates a single data path to each G path. For this purpose, an optimizing algorithm such as an algorithm for solving the knapsack problem is employed. In FIG. 12, there are four data-path combinations "D11, D21, D3," "D11, D22, D3," "D12, D21, D3," and "D12, D22, D3" for a combination of the G paths G1, G2, and G3. Each column of FIG. 12 corresponds to an execution time. If the same operation repeatedly appears in a given column, a conflict will occur in the column. For example, the data paths D11 and D21 use the same register R1 in the fourth column, to cause a conflict. The data path D3 conflicts with every other data path. Accordingly, the optimum solution calculator 630 provides no decisive solution. Instead, the conflict minimizer 640 provides a solution. If the data path D11 is selected for the G path G1, the data path D22 will be selected for the G path G2.

Figure 13:
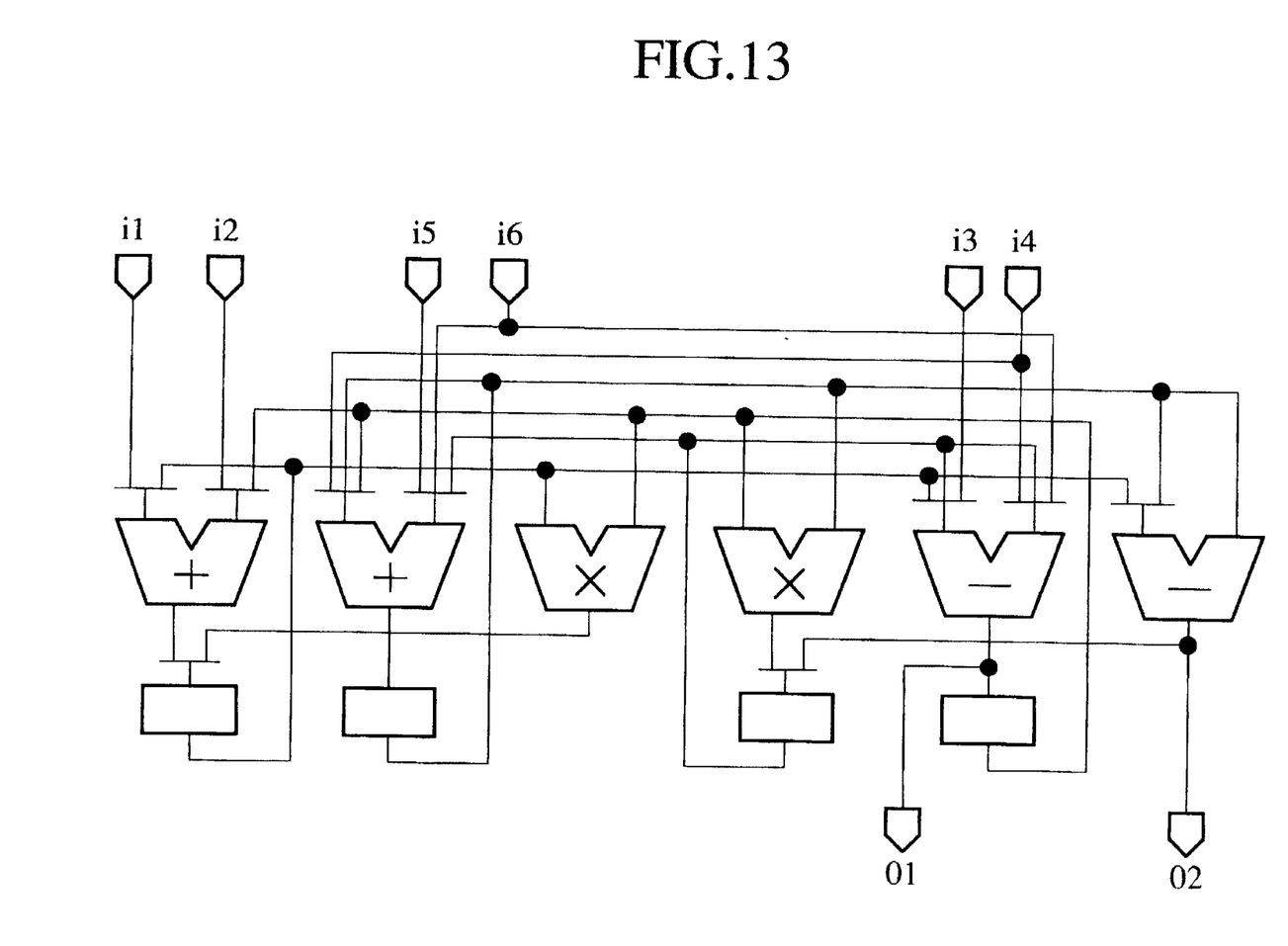
FIG. 13 shows a final logic circuit prepared by the second embodiment.

(7) For the G path G3 whose conflict has not been solved by the optimum solution calculator 630, the conflict minimizer 640 adds partial circuits including ALUs and internal connection lines to the initial circuit, to solve the conflict. In this embodiment, the conflict minimizer 640 adds an adder, a subtracter, and a register to the initial circuit, to solve the conflicts in the G path G3. Consequently, a final logic circuit shown in FIG. 13 is prepared.

In this way, the second embodiment limits the number of candidate data paths, to narrow a search space around an initial circuit. The present invention, therefore, is capable of designing an optimum logic circuit, even if it is large, like manual designing.

In summary, the present invention divides a large-scale behavioral description into partial graphs (partial behavioral descriptions) according to conditional values, to synthesize a larger circuit than that of the conventional high-level synthesis technique. The present invention optimizes each partial graph by adding parts to and modifying an initial circuit designed by a designer. While the prior art exhaustively searches a huge design space for a solution, the present invention searches locally partial regions in the neighborhood of the initial circuit for an optimum solution. And a burst or a divergence of the synthesized solution may be prevented beforehand. The present invention may employ known logic synthesis techniques or local transformation as rules for locally adding parts to or modifying the initial circuit. Also, it is easy to make rules with design know-hows in the present invention.

Various modifications will become possible for those skilled in the art after receiving the teachings of the present disclosure without departing from the scope thereof.

What is claimed is:

1. A logic synthesis apparatus comprising:
   a) first means for generating a control description graph according to a behavioral description graph written in a behavioral description language;
   b) second means for sorting the control description graph according to control conditions and extracting single flows including at least one of partial graphs and closed loops from the sorted control description graph;
   c) third means for providing an initial circuit;
   d) fourth means for dividing the single flows into execution steps;
   e) fifth means for allocating hardware parts that are necessary to the initial circuit for each of the execution steps and adding an additional circuit part not included in the initial circuit provided by the third means if an optimum combination of the hardware parts is not found; and
   f) sixth means for converting each of the single flows into a corresponding finite state machine and combining the finite state machines into one finite state machine.

2. An apparatus as claimed in claim 1, wherein said third means is connected to a hardware parts library that stores basic hardware parts including input terminals, output terminals, the number of execution steps, and connectable parts, and retrieves the initial circuit from the hardware parts library.

3. An apparatus as claimed in claim 1, wherein said third means comprises a graphical user interface.

4. An apparatus as claimed in claim 1, further comprising means disposed between said fifth means and said sixth means, for integrating the allocated hardware parts that carry out a same operation in different time bands into a shared part.

5. An apparatus as claimed in claim 1, wherein said fifth means comprises:
   a) a single flow divider for dividing the single flows into paths without overlapping ALUs among the paths;
   b) an initial circuit searcher for searching the initial circuit for candidate hardware parts that may realize the paths;
   c) an optimum solution calculator for finding the optimum combination of hardware parts for realizing the paths among the candidate parts; and
   d) a conflict minimizer for finding a minimum number of hardware parts including an additional hardware part for realizing the paths if the optimum combination of hardware parts is not found by the optimum solution calculator, and for adding the additional hardware part to the initial circuit.

6. An apparatus as claimed in claim 1, wherein said behavioral description graph is written in programming language C, as said behavioral description language in said first means.

7. An apparatus as claimed in claim 1, wherein said behavioral description graph includes at least one of a graphical representation of an adding operation and a graphical representation of a multiplying operation according to conditional value of a control variable.

8. An apparatus as claimed in claim 1, wherein the initial circuit is provided as a file through said third means.

9. A logic synthesis apparatus comprising:
   a) an input processing unit having means for generating a control description graph according to a behavioral description graph written in a behavioral description language, means for sorting the control description graph according to control conditions and extracting single flows including at least one of partial graphs and closed loops from the sorted control description graph, and means for providing an initial circuit;
   b) a CPU connected to said input processing unit, having means for dividing the single flows into execution steps, means for allocating hardware parts that are necessary to the initial circuit for each of the execution steps and adding an additional hardware part for a circuit part not included in the initial circuit if an optimum combination of the hardware parts is not found, means for converting each of the single flows into a corresponding finite state machine and combining the finite state machines into one finite state machine, first storage means for storing synthesis circuit files, and second storage means for storing logic synthesis simplification rules; and
   c) an output processing unit connected to said CPU.

10. An apparatus as claimed in claim 9, wherein said means for providing the initial circuit comprises a graphical user interface.

11. An apparatus as claimed in claim 9, further comprising means disposed between said means for allocating hardware parts and said means for combining finite state machines, for integrating the allocated hardware parts that carry out a same operation in different time bands into a shared part.

12. An apparatus as claimed in claim 9, wherein said means for allocating hardware parts comprises:
    a) a single flow divider for dividing the single flows into paths without overlapping ALUs among the paths;
    b) an initial circuit searcher for searching the initial circuit for candidate hardware parts that may realize the paths;
    c) an optimum solution calculator for finding the optimum combination of hardware parts for realizing the paths among the candidate hardware parts; and
    d) a conflict minimizer for finding a minimum number of hardware parts including an additional hardware part for realizing the paths if no optimum combination of hardware parts is found by the optimum solution calculator, and for adding the additional hardware part to the initial circuit.

13. An apparatus as claimed in claim 9, wherein said behavioral description graph is written in programming language C, as said behavioral description language.

14. An apparatus as claimed in claim 9, wherein said behavioral description graph includes at least one of a graphical representation of an adding operation and a graphical representation of a multiplying operation according to conditional value of a control variable.

15. An apparatus as claimed in claim 9, wherein said means for providing an initial circuit is connected to a hardware parts library that stores basic hardware parts including input terminals, output terminals, the number of execution steps, and connectable parts, and retrieves the initial circuit from the hardware parts library.

16. An apparatus as claimed in claim 9, wherein the initial circuit is provided as a file through said means for providing the initial circuit.

17. A method of logic synthesis comprising the steps of:
    a) generating a control description graph according to a behavioral description graph written in a behavioral description language;
    b) sorting the control description graph according to control conditions and extracting single flows including at least one of partial graphs and closed loops from the sorted control description graph;

c) providing an initial circuit; and d) modifying the initial circuit by adding an additional circuit part not included in the initial circuit to obtain a required logic circuit.

18. A method as claimed in claim 17, wherein said step d) includes the steps of:

dividing the single flows into execution steps; and allocating an additional hardware part to the initial circuit, to carry out the execution steps, the additional hardware part corresponding to the additional circuit part.

19. A method as claimed in claim 18, wherein the step of allocating includes the steps of:

a) dividing the single flows into paths without overlapping ALUs among the paths;

b) searching the initial circuit for candidate hardware parts that may realize the paths;

c) finding an optimum combination of hardware parts for realizing the paths among the candidate hardware parts; and d) adding the additional hardware part to the initial circuit if the optimum combination of the hardware parts is not found so as to find a minimum number of the hardware parts including the additional hardware part for the initial circuit.

20. A method as claimed in claim 19, wherein the step of finding the optimum combination of hardware parts includes the steps of:

a) determining if any conflict exists among a component of the initial circuit which must be used to realize more than one of the paths;

b) if no conflicts exist, outputting the initial circuit as the optimum combination of the hardware parts, and if a conflict does exist, adding the additional hardware part to the initial circuit and returning to the step a).

* * * * *